Oct. 17, 1967 G. A. DOYLE 3,348,105

PLASTIC PACKAGE FULL WAVE RECTIFIER

Original Filed Feb. 4, 1963 2 Sheets-Sheet 1

INVENTOR.
George A. Doyle

BY Mueller & Aichele

ATTY'S.

Oct. 17, 1967 G. A. DOYLE 3,348,105

PLASTIC PACKAGE FULL WAVE RECTIFIER

Original Filed Feb. 4, 1963 2 Sheets-Sheet 2

INVENTOR.
George A. Doyle

BY Mueller & Aichele

ATTY'S.

3,348,105
Patented Oct. 17, 1967

1

3,348,105

PLASTIC PACKAGE FULL WAVE RECTIFIER

George Allen Doyle, North Palm Beach, Fla., assignor to Motorola, Inc., Franklin Park, Ill., a corporation of Illinois Continuation of application Ser. No. 255,824, Feb. 4, 1963. This application Sept. 20, 1965, Ser. No. 493,608
7 Claims. (Cl. 317—234)

ABSTRACT OF THE DISCLOSURE

The invention described shows a plurality of semiconductor wafers connected in a bridge circuit with a terminal projecting from each connection between wafers and with a solid mass of insulation incapsulating the bridge assembly.

This application is a continuation of application Ser. No. 255,824, filed Feb. 4, 1963.

The invention described herein relates to semiconductor rectifiers, and more particularly to an improved plastic encapsulated full wave rectifier assembly.

In many types of equipment which require rectified AC power, economies can be realized by the use of pre-packaged rectifier assemblies. Such assemblies can be made small and can be manufactured at relatively low cost, so the interconnection of individual components in manufacturing the equipment can be eliminated, without increasing the size of the equipment. Most available semiconductor rectifier assemblies are of the type which have prefabricated diode devices with hermetically sealed containers molded in a plastic encapsulating material. Although these assemblies offer some cost reduction, lower cost and smaller size are possible by eliminating the use of individual pre-packaged diodes. However, difficulties have been encountered in providing a satisfactory arrangement of leads and semiconductor elements. Some units have required intricate welding or soldering of individual semiconductor elements to form the full wave bridge circuit. It is desirable to avoid multiple soldering or welding steps in connecting the diode elements to form the basic circuit. Also, it is desirable to have a rectifier assembly with AC leads and DC leads which are in a common plane, particularly for printed circuit applications where space is saved if the assembly lies flat on the circuit board.

It is an object of this invention to provide a full wave bridge rectifier assembly of a configuration such that the rectifier elements and leads can be soldered together simultaneously in a single step.

Another object of the invention is to reduce the size of plastic encapsulated full wave rectifier assemblies by means of specially designed lead elements.

A feature of the invention is a plastic encapsulated full wave rectifier assembly of a planar type which has AC leads projecting from one side of the device and DC leads projecting from the other side of the device.

Another feature of the invention is a rectifier assembly which can be manufactured by a comb lead technique such that multiple units can be assembled and soldered simultaneously.

Afurther feature of the invention is an improved full wave rectifier assembly of reduced size and higher reliability as compared to commercially available units.

A full wave rectifier in accordance with the invention includes semiconductor rectifier elements soldered between two pairs of flat leads. In one embodiment there are four individual semiconductor elements, and in another there are two semiconductor elements, each of which contains two rectifying junctions. The leads are flat strips which have a unique configuration such that the semiconductor elements can be assembled and soldered between them in a single step. By using a comb-like structure with multiple leads, several bridge rectifiers can be assembled and soldered simultaneously. The semiconductor elements and the mounting portions of the leads are then encapsulated in a plastic material by a transfer molding step. In the final rectifier assembly, the two AC inlet leads extend from one side of a molded plastic block, and the two DC outlet leads extend from the other side of the molded plastic block for ready identification of the leads and to facilitate making external electrical connections.

2

Figure 1:
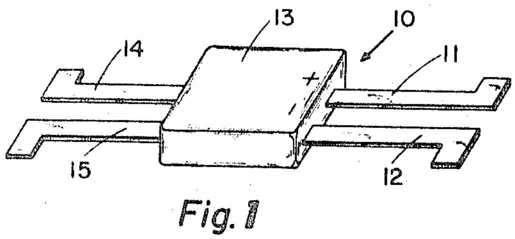
FIG. 1 is a perspective view of a full wave bridge rectifier assembly in accordance with the invention.

The invention will be described in detail with reference to the accompanying drawings. Referring first to FIG. 1, there is shown a full wave rectifier assembly 10 to a scale of about four times actual size. The rectifier assembly includes two DC leads 11 and 12 projecting from one side of a plastic block 13, and two AC leads 14 and 15 projecting from the other side of the plastic block. In this embodiment, positive and negative designations for the leads 11 and 12 are molded in the plastic block 13. The leads may be bent to extend perpendicular to the plane of the unit 10 for applications requiring that the leads be plugged into a socket. In this case, the tabs at the ends of the leads are formed into a cylindrical shape to fit into receptacles and hold the device in place by a spring action.

Figure 2:
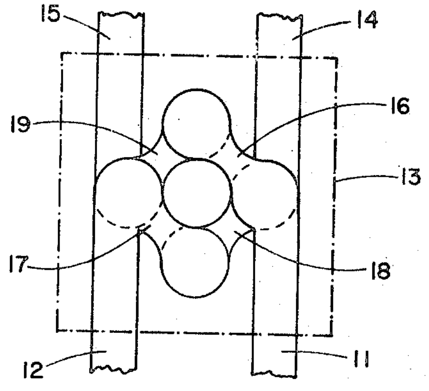
FIG. 2 is a plan view showing the internal construction of the rectifier assembly of FIG. 1.

The internal construction of the assembly 10 and a suitable process for manufacturing it will be described with reference to FIGS. 2, 3 and 4. The leads 11 and 12, 13 and 14 are flat metal strips which have mounting portions 16, 17, 18 and 19 within the plastic encapsulating material, as shown in FIG. 2. As viewed from the top in FIG. 2, the mounting portions as assembled form a generally rectangular or square configuration, and four semiconductor rectifier elements are located at the corners of the square and are soldered between the two pairs of leads.

Figure 3:
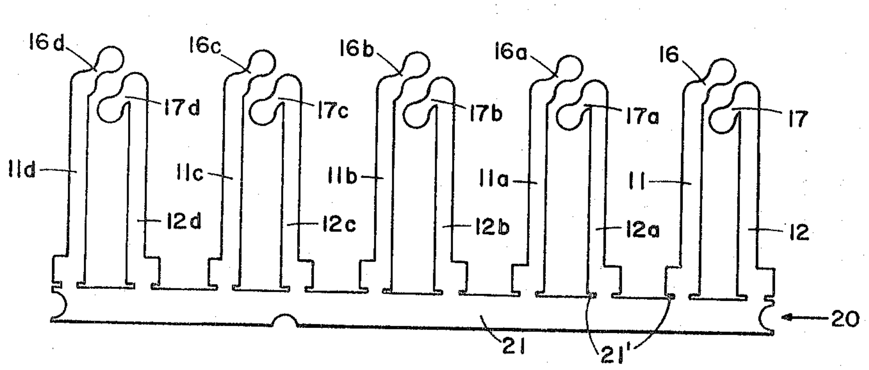
FIG. 3 is a plan view of a comb lead structure for fabricating several rectifier assemblies simultaneously.

FIG. 3 is a plan view of a lead comb which may be used in fabricating the assembly 10, and this view also illustrates the configuration of the leads. The comb 20 provides pairs of leads for five rectifier assemblies as illustrated in FIG. 3, and an identical comb is used to provide the other pair of leads for the five assemblies. The leads 11 and 12 with mounting portions 16 and 17 for the assembly 10 of FIGS. 1 and 2 are at the right-hand end of the comb 20 as shown in FIG. 3. The leads for other assemblies are identified by the same numbers followed by letters *a*, *b*, *c* and *d*. The leads are formed integral with a coupon strip 21 which is detached when the assemblies are completed. The comb structure 20 can be fabricated conveniently by stamping or etching it from a metal sheet, preferably of copper. Small notches are formed at 21' to relieve stress at the junction of the leads with strip 21. This insures that the leads will lie flat.

Figure 4:
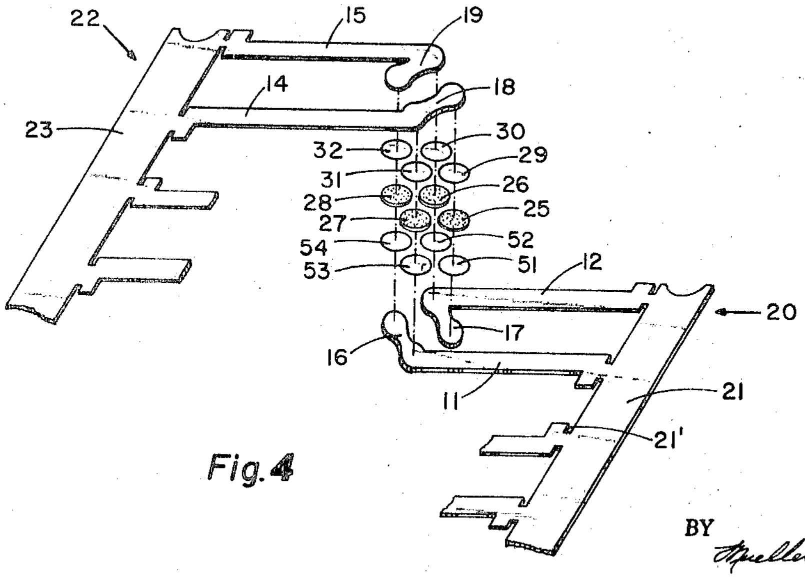
FIG. 4 is an exploded view showing the maner in which the bridge rectifier is assembled using the comb of FIG. 3.

It may be seen in FIG. 3 and also in FIG. 4, that the lead portions 11 and 12 extend parallel to each other, and the mounting portions 16 and 17 are also parallel to each other but at angles with respect to the lead portions. The mounting portion 16 forms a 135° angle with the lead portion 11, and the mounting portion 17 forms a 45° angle with the lead portion 12. With this particular lead configuration, identical comb structures can be used for all of the leads, so right-hand and left-hand orientation during assembly is not necessary.

The manner in which the assembly 10 is fabricated is illustrated in FIG. 4. Four semiconductor rectifier elements, known as dice, are assembled along with solder disks between the mounting portions of the leads 11, 12, 14 and 15. The procedure is as follows. The comb 20 is placed in a soldering jig (not shown). Solder preforms 51, 52, 53 and 54 are placed on each of the enlarged areas of the mounting portions 16 and 17. Four semiconductor rectifier elements 25, 26, 27 and 28 are then placed on the enlarged areas of the lead mounting portions on top of the solder preforms. The semiconductor elements 25 and 26 are oriented so that their cathode side is placed down on the mounting portion 17, and the semiconductor elements 27 and 28 are oppositely oriented so that their anode sides are placed down on the mounting portion 16. Solder preforms 29, 30, 31 and 32 are then placed on top of the rectifier elements. Another comb structure 22 is placed over the first one so that the mounting portions 18 and 19 are on the stacked rectifier elements and solder disks. The jig top is placed over the assembly, and the jig is passed through a soldering furnace to melt and resolidify the solder in order to connect the rectifier elements to the leads. In the soldered assembly, the mounting portion 18 connects the anode of element 25 to the cathode of element 27, and mounting portion 19 connects the anode of element 26 to the cathode of element 28.

A plastic package is then molded around the semiconductor elements and the mounting portions of the leads. The best results have been obtained by transfer molding the package. Silicone plastics and epoxy plastics are suitable materials for molding the package. Complete curing of the plastic is achieved by a post cure of the molded package. After curing, the individual rectifier assemblies are separated from the combs by shearing the leads from the interconnecting strips 21 and 23.

Semiconductor dice of silicon for these assemblies are prepared by known processes. The dice have a passivating lead oxide coating formed on their peripheral surface. The rectifier elements may be of the zener type, if desired.

Figure 5:
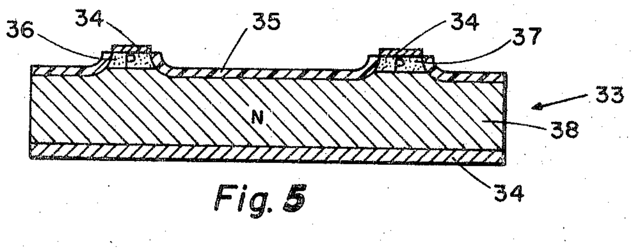
FIGS. 5 and 6 show double-diode semiconductor elements for another embodiment of the invention.
Figure 6:
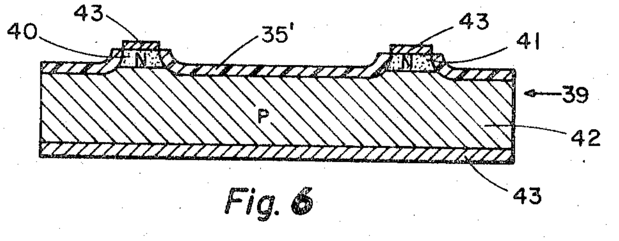
Figure 7:
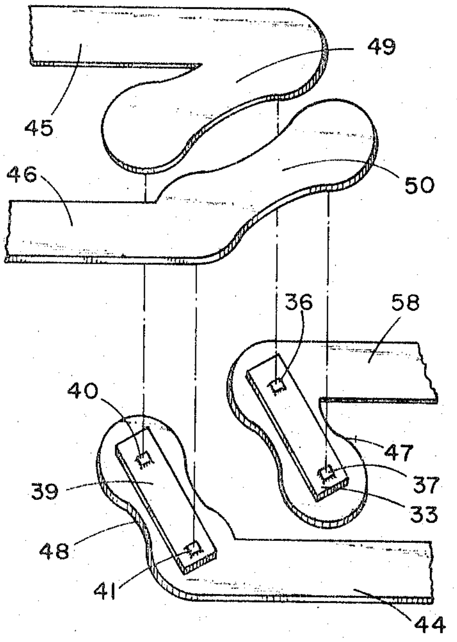
FIG. 7 is an exploded view showing how the double-diode elements of FIGS. 5 and 6 are assembled with leads.

FIGS. 5, 6 and 7 illustrate another embodiment of the invention. This embodiment has two double-diode semiconductor elements, each of which contains two rectifying junctions, so the final assembly has four junctions just as in the embodiment of FIGS. 1–4. A double-diode of one polarity is shown in FIG. 5, and the semiconductor element 33 has two isolated P-type regions 36 and 37 formed on a common N-type region 38. The opposite polarity double-diode of FIG. 6 is a semiconductor element 39 with two N-type regions 40 and 41 formed on a common P-type region 42. Surfaces of the P and N regions are metallized to provide contacts 34. In FIGS. 5 and 6, the P-type regions are anodes and the N-type regions are cathodes. The metallized contacts are at 43. There is a passivating lead oxide coating 35 and 35' on the upper surface of the elements 33 and 37 which covers the junctions formed between the P and N regions.

FIG. 7 shows how the double-diode elements 33 and 39 are assembled with leads and soldered. The leads 58, 44, 45 and 46 are flat metal strips which have substantially the same configuration as those of the embodiment of FIGS. 1–4. The cathode side of the semiconductor element 33 is placed down on the mounting portion 47 of lead-strip 58 and the anode side of semiconductor element 39 is placed down on the mounting portion 48 of the lead-strip 44. In this embodiment, the leads have been clad with solder so that separate solder preforms are not required, and obviously, the leads 11, 12, 14 and 15 may be solder-clad if desired.

The mounting portion 49 of lead 45 is placed on the anode 36 of element 33 and also on the cathode 40 of element 39. Similarly, the mounting portion 50 of lead 46 is placed on the anode 37 of element 36 and also on the cathode 41 of element 39. Thus, the two leads 45 and 46 are the AC inlet leads and the other two leads 58 and 44 are the DC outlet leads.

The assembly of FIG. 7 is soldered in a furnace and the semiconductor elements are encapsulated with plastic in the same manner as described in connection with FIGS. 1–4. The final encapsulated assemblies appear identical to that of FIG. 1.

Figure 8:
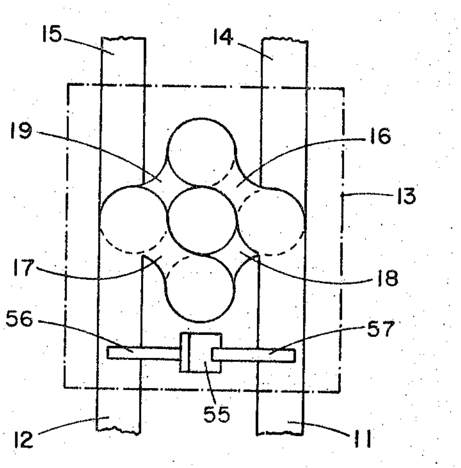
FIG. 8 is a plan view of a further embodiment which includes a thin-film capacitor molded in the plastic block along with the semiconductor elements and serving as a filter.

FIG. 8 is a view similar to FIG. 2, but showing an assembly in which a thin-film capacitor 55 is connected between the DC outlet leads 11 and 12 and encapsulated in the plastic material 13 along with the semicondutcor elements. Such capacitors are known in the art. They usually consist of an insulating film between two metal films, one of which is deposited on a suitable substrate such as a ceramic material. Connections 56 and 57 are provided between the metal films and the DC leads in the assembly of FIG. 8. The capacitor serves to filter the output to remove ripple voltage, and it provides sufficient filtering for some applications.

Bridge rectifier assemblies in accordance with the invention have a favorable combination of mechanical and electrical characteristics. The final assembly is small and yet it is dense and structurally sound. Typical assemblies have a package size of one quarter inch square by three thirty-seconds inch thick. The assemblies have good thermal and electrical conductivity due to the direct contact of copper leads to the semiconductor elements. The semiconductor elements and leads are assembled and then simultaneously soldered, so intricate soldering or welding techniques for forming the circuit are avoided. During the assembly, soldering and molding operations, the leads are handled in a comb structure which assures both alignment and strength in the final units as well as low cost of manufacture.

I claim:

1. A bridge rectifier assembly, comprising four flat metal strips having overlapping mounting portions with a first pair of said strips having lead portions projecting in one direction and a second pair of said strips having lead portions projecting in the opposite direction, the mounting portions of said first pair of strips extending parallel to each other and at an angle relative to the lead portions thereof, and the mounting portions of said second pair of strips extending parallel to each other and at right angles to said first-mentioned mounting portions, semiconductor material soldered between the mounting portions of said pairs of strips, said semiconductor material containing four PN junctions, two of said junctions having a common cathode connection to the mounting portion of one of said first pair of strips and having individual anode connections to the mounting portions of separate ones of said second pair of strips, and the other two of said junctions having a common anode connection to the mounting portion of the other of said first pair of strips and having individual cathode connections to the mounting portions of separate ones of said second pair of strips, and insulating material encapsulating said semiconductor material and the mounting portions of said strips.

2. The rectifier assembly of claim 1 having a thin film capacitance element connected between the lead portions of said first pair of strips and within said insulating material for filtering an electrical output from said rectifier assembly.

3. A bridge rectifier assembly, comprising four semiconductor rectifier elements supported in a common plane and each having an anode and a cathode, first and second metal connectors having mounting portions at one side of said rectifier elements and having lead portions both extending in one direction and parallel to said plane, third and fourth metal connectors having mounting portions at the opposite side of said rectifier elements and having lead portions both extending in the direction opposite said one direction and parallel to said plane, said mounting portions of said first and third connectors each forming a forty-five degree angle with the lead portion thereof, and said mounting portions of said second and fourth connectors each forming a hundred thirty-five degree angle with the lead portions thereof so that said mounting portions define a rectangle with said rectifier elements positioned at the corners thereof, two of said rectifier elements having their cathodes soldered to the mounting portion of one of said first and second connectors and their anodes soldered respectively to the mounting portions of said third and fourth connectors, the other two of said rectifier elements having their anodes soldered to the mounting portion of the other of said first and second connectors and their cathodes soldered respectively to the mounting portions of said third and fourth connectors, and means encapsulating said rectifier elements and said mounting portions with said lead portions projecting from said encapsulating means and available for making external electrical connections.

4. In a semiconductor device having a molded housing encapsulating a plurality of semiconductor elements and their associated electrical connector means, the combination of a plurality of one-piece metal members comprising said electrical connector means, with two of said plurality of one-piece metal members each having an enlarged-mounting portion at one end thereof and a lead portion extending from the enlarged-mounting portion and out of the molded housing, with another one-piece metal member of said plurality of members having two enlarged-mounting portions at one end thereof and a lead portion extending away therefrom and out of the molded housing, a semiconductor element secured at one face on said enlarged-mounting portion on each one of said two of said plurality of members, with said two secured semiconductor elements on said mounting portions being spaced apart and separated laterally from one another, with each of said two enlarged-mounting portions on said another one-piece metal member being in engagement with the other side of a corresponding one of said two semiconductor elements, and with said enlarged-mounting portions and semiconductor elements all being encapsulated in a position wherein said two enlarged-mounting portions on said another metal member interconnect the semiconductor elements which are secured one on each said mounting portion of each of said two one-piece metal members.

5. In an encapsulated semiconductor device as defined in claim 4 wherein the lead portion of each of said two one-piece metal members extends in one direction from the molded housing, and the lead portion of said another one-piece metal member extends from the molded housing in the opposite direction.

6. In a semiconductor device having a molded housing encapsulating four semiconductor elements and their associated electrical connector means, the combination of four one-piece flat metal members comprising said electrical connector means, each said member having an angularly extending mounting portion and a lead portion extending from one end of the mounting portion and out of the molded housing, with each said mounting portion having two interconnected but spaced apart supporting areas, four semiconductor elements, one of said elements being mounted on each supporting area of two of said flat members with one side of each element facing toward the metal member, the other two of said flat members each having its two corresponding supporting areas mechanically and electrically connected with a corresponding semiconductor element at the other side of said element, and with the mounting portions and semiconductor elements encapsulated in a position wherein the two mounting portions on one flat member interconnect two semiconductor elements on two independent separated flat members.

7. In a semiconductor device having a molded housing encapsulating four semiconductor elements and their associated electrical connector means, the combination of two substantially identical pairs of one-piece flat metal members comprising said electrical connector means, each said members having an angularly extending mounting portion and a lead portion extending from one end of the mounting portion and out of the molded housing, with each said mounting portion having two interconnected but spaced apart supporting areas, four semiconductor elements, one of said elements being mounted on each supporting area of one of said pairs of flat members with one side of each element facing toward the metal member, the other pair of said flat members each having its two corresponding supporting areas mechanically and electrically connected with a corresponding semiconductor element at the other side of said element, and with the mounting portions and semiconductor elements encapsulated in a position wherein the two mounting portions on one flat member of one of said pairs of members interconnect two semiconductor elements on two independent separated flat members of the other of said pairs of flat members.

References Cited

UNITED STATES PATENTS

| | | | |
|---|---|---|---|
| 2,906,931 | 9/1959 | Armstrong | 317—235 |
| 2,994,121 | 8/1961 | Shockley | 317—234 |
| 3,030,562 | 4/1962 | Maiden et al. | 317—235 |
| 3,134,935 | 5/1964 | Parsons et al. | 317—234 |
| 3,249,829 | 5/1966 | Everett et al. | 317—234 |

JAMES D. KALLAM, *Primary Examiner.*